United States Patent
Orozco

(10) Patent No.: US 8,089,735 B2
(45) Date of Patent: Jan. 3, 2012

(54) HYBRID POWER RELAY WITH THERMAL PROTECTION

(75) Inventor: Sergio Orozco, Tijuana (MX)

(73) Assignee: Custom Sensors & Technologies, Inc., Moorpark, CA (US)

( * ) Notice: Subject to any disclaimer, the term of this patent is extended or adjusted under 35 U.S.C. 154(b) by 354 days.

(21) Appl. No.: 12/325,466

(22) Filed: Dec. 1, 2008

(65) Prior Publication Data

US 2010/0134931 A1    Jun. 3, 2010

(51) Int. Cl.
*H02H 3/00* (2006.01)

(52) U.S. Cl. .......................................................... 361/8

(58) Field of Classification Search .................... 361/8
See application file for complete search history.

(56) References Cited

U.S. PATENT DOCUMENTS

| | | | |
|---|---|---|---|
| 2,789,253 A | | 4/1957 | Vang |
| 3,237,030 A | | 2/1966 | Coburn |
| 3,321,668 A | | 5/1967 | Baker |
| 3,558,910 A | * | 1/1971 | Dale et al. ...................... 307/134 |
| 3,639,808 A | | 2/1972 | Ritzow |
| 4,074,333 A | | 2/1978 | Murakami et al. |
| 4,241,494 A | * | 12/1980 | Woods ............................. 29/619 |
| 4,264,034 A | * | 4/1981 | Hyltin et al. ................. 236/46 R |
| 5,238,369 A | * | 8/1993 | Farr ................................. 417/18 |
| 5,283,706 A | | 2/1994 | Lillemo et al. |
| 5,528,443 A | | 6/1996 | Itoga et al. |
| 5,790,354 A | | 8/1998 | Altiti et al. |
| 6,163,129 A | * | 12/2000 | Younger et al. ............... 318/799 |
| 6,347,024 B1 | * | 2/2002 | Blain et al. ........................ 361/3 |
| 6,621,668 B1 | * | 9/2003 | Sare ................................ 361/13 |
| 7,344,629 B2 | * | 3/2008 | Holmes et al. ................ 204/536 |

OTHER PUBLICATIONS

Satronix (India) Pvt. Ltd., Din Rail Mount Hybrid Non-Heat Three Phase SSR, www.satronixindia.com/pdf/din_rail_mount_hybridssr.pdf, India.
Watlow Electric Manufacturing Company, E-SAFE Mercury-Free Relay, www.watlow.co.uk/literature/specsheets/files/controllers/winesr0203.pdf, 2003, USA.

* cited by examiner

*Primary Examiner* — Rexford Barnie
*Assistant Examiner* — Tien Mai
(74) *Attorney, Agent, or Firm* — Edward S. Wright

(57) ABSTRACT

Hybrid power relay for making and breaking an electrical circuit which includes electromagnetically operated contacts for making and breaking the circuit, a solid state switch connected across the contacts, a control circuit responsive to a control signal for actuating the solid state switch and the contacts such that the solid state switch closes before the contacts to make the circuit and the contacts open before the solid state switch to break the circuit, and a protective circuit for monitoring the temperature of the solid state switch and opening the switch in the event of a rise in temperature produced by abnormal current flow in the switch due to failure of the contacts to make and maintain the circuit.

20 Claims, 3 Drawing Sheets

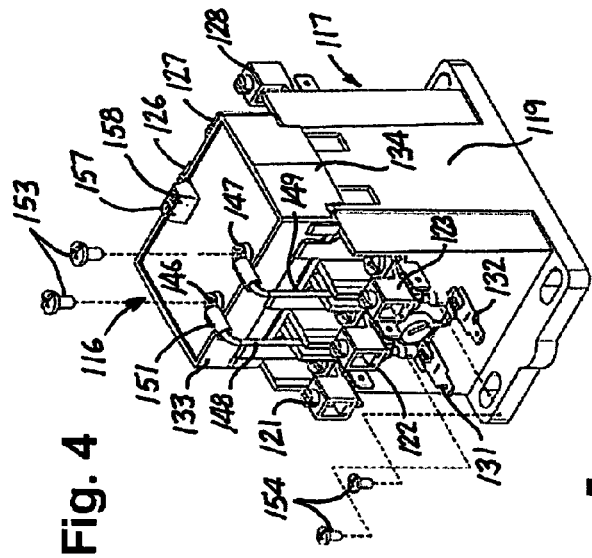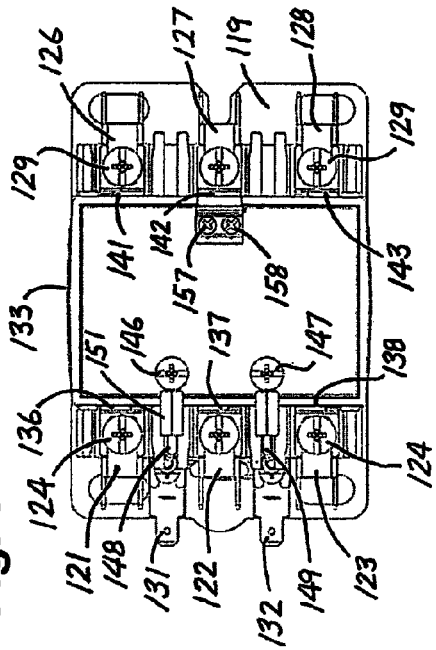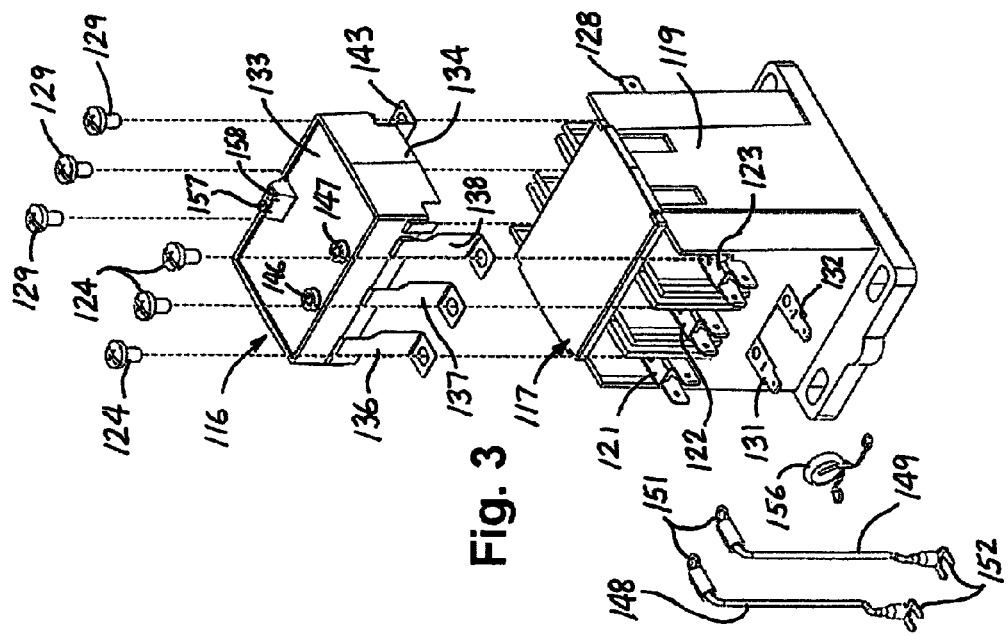

US 8,089,735 B2

HYBRID POWER RELAY WITH THERMAL PROTECTION

BACKGROUND OF THE INVENTION

1. Field of Invention

This invention pertains generally to relays for opening and closing electrical power circuits and, more particularly, to a hybrid power relay having both electromechanical and solid state switching elements.

2. Related Art

The two most common types of switching devices currently available for making and breaking electrical power circuits are electromechanical contactors or relays having mechanical contacts that can be opened or closed by electromagnetic forces, and solid state relays or switches which have no mechanical switching contacts.

The mechanical contacts can generally carry higher electrical currents and thus be used for heavier loads than solid state switching devices, but they are subject to arcing when opened or closed. The solid state devices generally require large heat sinks to protect them from overheating.

Heretofore, there have been some attempts to provide hybrid power relays having both electromechanical contacts and solid state switching, and examples of such devices are found in U.S. Pat. Nos. 2,789,253, 3,237,030, 3,321,668, 3,558,910, 3,639,808, 4,074,333, 5,283,706, 5,528,443, 5,790,354, 6,347,024, and 6,621,668.

OBJECTS AND SUMMARY OF THE INVENTION

It is, in general, an object of the invention to provide a new and improved hybrid power relay.

Another object of the invention is to provide a hybrid power relay of the above character which overcomes the limitations and disadvantages of power relays heretofore provided.

These and other objects are achieved in accordance with the invention by providing a hybrid power relay for making and breaking an electrical circuit which includes electromagnetically operated contacts for making and breaking the circuit, a solid state switch connected across the contacts, means responsive to a control signal for actuating the solid state switch and the contacts such that the solid state switch closes before the contacts to make the circuit and the contacts open before the solid state switch to break the circuit, and means for monitoring the temperature of the solid state switch and opening the switch in the event of a rise in temperature produced by abnormal current flow in the switch due to failure of the contacts to make and maintain the circuit.

BRIEF DESCRIPTION OF THE DRAWINGS

FIG. 3 is an exploded isometric view, partly exploded of another embodiment of a hybrid power relay according to the invention.

FIG. 4 is a view similar to FIG. 3 with the solid state switch module mounted on the contactor.

FIG. 5 is a top plan view of the embodiment of FIG. 3.

DETAILED DESCRIPTION

Figure 1:
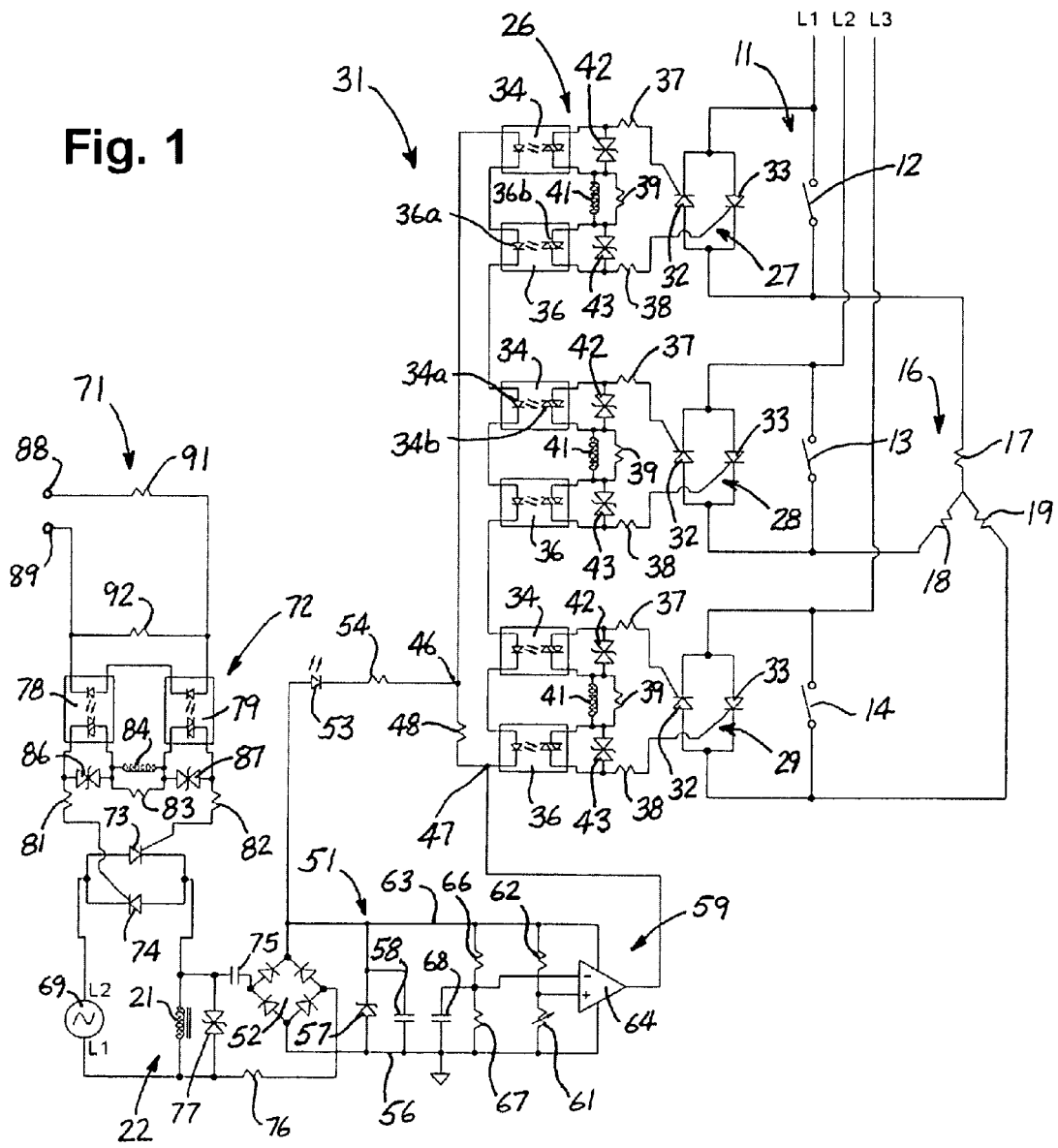
FIG. 1 is a circuit diagram of one embodiment of a hybrid power relay incorporating the invention.

In FIG. 1, the invention is illustrated in connection with a conventional three-phase, three wire alternating current (AC) electrical power system having line conductors L1, L2, and L3. However, it will be understood that the invention can be also be employed with other power systems, including three-phase, four wire systems and single-phase systems.

The hybrid power relay includes a mechanical switching section 11 that includes three sets of contacts 12, 13, and 14 for making and breaking electrical circuits between the line conductors and a three-phase load 16 represented by resistors 17, 18, and 19 which are shown as being connected in a Y-configuration. The contacts are electromagnetically operated and can, for example, be the contacts of one or more electromechanical relays (EMRs), contactors, or definite purpose contactors. In the embodiment illustrated, opening and closing of the contacts is controlled by a single operating coil 21 which is shown in the mechanical driver section 22 of the device.

The relay also has an electronic switching section 26 with solid state switches 27, 28, 29 connected in parallel with, or across, contacts 12, 13, and 14, and a solid state driver 31 for the switches. Each of the electronic switches has a pair of silicon controlled rectifiers (SCRs) 32, 33 connected back-to-back across the associated contacts, with the cathode of SCR 32 and the anode of SCR 33 connected to one of the contacts and the anode of SCR 32 and the cathode of SCR 33 connected to the other contact.

Trigger signals are applied to the control gates of the SCRs by optocouplers 34, 36 which are shared between the switching section and the driver stage. Each of the optocouplers has a light emitting diode (LED) 34a, 36a coupled optically to a photodiode 34b, 36b which produces a DC output voltage in response to light produced by application of an input signal to the LED. One of the outputs of each of the optocouplers is connected to the control gate of one of the SCRs 32, 33 through a coupling resistor 37, 38, and a matching network consisting of a resistor 39 and an inductor 41 is connected between the other outputs of the optocouplers. Transient Voltage Suppressors (TVSs) 42, 43 are connected across the outputs of the optocouplers to suppress transient voltages and protect the solid state devices from voltage spikes.

In the driver stage, the inputs of all six of the optocouplers 34, 36 are connected in series between input terminals 46, 47, and an input resistor 48 also connected between the terminals.

Operating power for the solid state switches is provided by a direct current (DC) power supply 51 which includes a bridge rectifier 52. The positive output of the bridge rectifier is connected to input terminal 46 via a light emitting diode 53 and a resistor 54, and the negative output is connected to a ground line 56. A Zener diode 57 and a capacitor 58 are connected across the outputs of the bridge rectifier to regulate and smooth the DC output.

A thermal protection circuit 59 turns off the solid state switches in the event of over-heating of the SCRs as might, for example, happen if the relay contacts were to fail to close or to maintain a circuit and excessive current were to flow through the SCRs as a result. This circuit includes a temperature sensor which, in this particular embodiment, consists of a thermistor 61 positioned in close proximity to the SCRs in all three of the switches. The thermistor is connected in series with a dropping resistor 62 between the positive output line 63 of the DC power supply and ground line 56 to provide a voltage across the thermistor corresponding to the resistance of the thermistor and, hence, the temperature to which it is subjected.

The voltage developed across the thermistor is applied to the positive input of a comparator 64, and a reference voltage provided by a voltage divider consisting of resistors 66, 67 connected between the positive supply line and ground is applied to the negative input of the comparator. The output of the comparator is connected to input terminal 47 of drive stage 31. As long as the thermistor voltage is below the level of the reference voltage, the output of the comparator remains low, input terminal 47 is maintained at or near the DC ground potential, the voltage between input terminals 46 and 47 is large enough to drive optocouplers 34, 36 to provide the bias necessary to keep SCRs 34, 36 in the ON state. A capacitor 68 is connected between the negative input of the comparator and ground to provide AC filtering and eliminate fluctuations in the state of the comparator.

Operating coil 21 and DC power supply 51 are energized by current from the AC power system, represented as an AC source 69, through a control circuit 71. The control circuit includes a solid state switch or relay 72 similar to switches 27-29, with a pair of SCRs 73, 74 connected back-to-back in series with coil 21 between lines L1, L2 of the AC power system. The operating coil is connected in parallel with the input of the DC supply, and input current is supplied to bridge rectifier 52 from lines L1, L2 through a capacitor 75 and a resistor 76. A metal oxide varistor 77 is connected across the coil and the input of the DC supply to suppress transient voltages and protect the solid state switching devices from voltage spikes when the coil is energized and the solid state switching devices are receiving their control signals.

Like solid state switches 27 29, The AC switch or control circuit also includes a pair of optocouplers 78, 79 with first outputs connected to the control gates of SCRs 73, 74 via resistors 81, 82 and second outputs connected together through a matching network consisting of a resistor 83 and an inductor 84. Transient Voltage Suppressors (TVSs) 86, 87 are connected across the outputs of the optocouplers to suppress transient voltages and protect the solid state devices from voltage spikes.

The AC switch is controlled by a low voltage, e.g. 5 volt, DC control signal applied to input terminals 88, 89. The inputs of optocouplers 78, 79 are connected in series, and the control signal is applied to them through a voltage divider consisting of resistors 91, 92 connected between the input terminals and the inputs of the optocouplers.

In the absence of the control signal, SCRs 73, 74 remain in an OFF state, with relay coil 21 and DC power supply 51 both de-energized, relay contacts 12 14 and solid state switches 27 29 all open, and no current flowing to the load.

Upon the application of a DC control signal to input terminals 88, 89, optocouplers 78, 79 deliver trigger signals which turn on SCRs 73, 74, thereby simultaneously energizing operating coil 21 and DC supply 51. The output voltage from the DC supply turns on optocouplers 34, 36 which deliver trigger signals to SCRs 32, 33, thereby turning on the SCRs to connect the three-phase load 16 to AC supply lines L1, L2, L3. This happens almost instantaneously, with SCRs 32, 33 typically being fully turned on less than 100 microseconds after the power supply is energized.

Although the operating coil is energized at the same time as the DC power supply, due to the inherent delay in the build-up of the coil(s magnetic field and the subsequent travel time of the EMR contacts, the contacts do not close until several milliseconds after the coil is energized and well after the solid state switches have fully switched on the load current in each phase.

Being turned on first, the SCRs conduct the initial load currents and any associated transient currents with virtually no arcing. When the contacts close, the voltage across them is equal to the forward voltage drop across the SCRs, which is typically on the order of only 1.1 to 1.4 volts. Hence, there is no arcing across the contacts, and no transients are generated by their closing.

Once the contacts are closed, the voltage drop across them and across the SCRs is lower than the minimum operating voltage of the SCRs. This causes the SCRs to open, with the load current thereafter being carried entirely by the EMR contacts, thereby avoiding heating of the SCRs and the need for heat sinks or other cooling.

To open the circuits and disconnect the load from the lines, the control signal is removed from AC switch 72, which causes SCRs 73, 74 to open on the next zero crossings of the current through them, thereby de-energizing operating coil 21 and DC supply 51. The EMR contacts are urged toward their open positions by a return spring, and when the coil(s magnetic field falls to the point that it is overcome by the force of the spring, contacts 12 14 begin to open.

Even though the DC supply has been turned off, charge stored in capacitor 58 continues to supply operating voltage to optocouplers 34, 36, and the optocouplers continue to bias the SCRs 32, 33 for conduction. At the instant the contacts begin to open, the voltages across the SCRs begin to rise, and the SCRs turn back on, typically in less than 100 microseconds, extinguishing any arc that might result from the opening of the contacts. The SCRs remain turned on for approximately one AC cycle, typically about 16 to 20 milliseconds, depending upon the line frequency, which permits the contacts to open fully and return to their fully off position. The SCRs stop conducting load current at the next zero crossing of the current in each phase, without the transients that typically occur when EMR contacts open. This completely eliminates the electrical noise and mechanical damage that might otherwise occur, thereby extending the life of the contacts significantly.

In the event that one or more of the SCRs should overheat or if the ambient temperature should become too high, the voltage developed across thermistor 61 will exceed the threshold level set by resistors 66, 67, causing comparator 64 to switch to from its low output state to its high output state, thereby interrupting the current to optocouplers 34, 36 and turning off SCRs 32, 33. Such overheating might, for example, occur if one or more of the EMR contacts should fail to close or to maintain a closed circuit. The SCRs will remain turned off as long as the temperature is above the threshold level and comparator is in its high output state.

When the temperature drops back below the threshold level and the thermistor voltage drops below the reference level, the comparator will return to its low output state, thereby resetting the protection circuit and restoring operating current to optocouplers 34, 36.

As long as current is being delivered to the optocouplers from the DC supply, LED 53 will be illuminated to provide a visual indication that a control signal is being delivered to solid state switches 27 29.

Figure 2A:
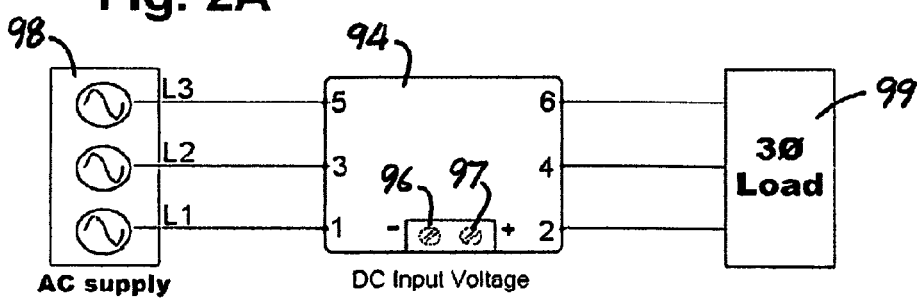
FIGS. 2A-2D are block diagrams illustrating use of the embodiment of FIG. 1 in both three-phase systems and single-phase systems.

Although the embodiment of FIG. 1 is designed for use with three-phase power systems and loads, it can be utilized with single-phase systems and loads as well. In FIGS. 2A 2D, the relay is illustrated as having a housing 94 with input terminals 1, 3, 5 for the line connections, output terminals 2, 4, 6 for the load connections, and input terminals 96, 97 for the control signal. Circuits between input terminal 1 and output terminal 2, input terminal 3 and output terminal 4, and input terminal 3 and output terminal 6 are made and broken by contacts 12, 13, and 14 and by solid state switches 27, 28, and 29, respectively.

FIG. 2A illustrates use of the relay with a standard 220 or 440 volt three-phase AC supply 98 and a three-phase load 99, as in FIG. 1. In this embodiment, line conductors L1, L2, and L3 are connected to input terminals 1, 3, and 5, and the load is connected to output terminals 2, 4, and 6. The hybrid relay can also be used in a four-wire, three-phase system, if desired.

Figure 2B:
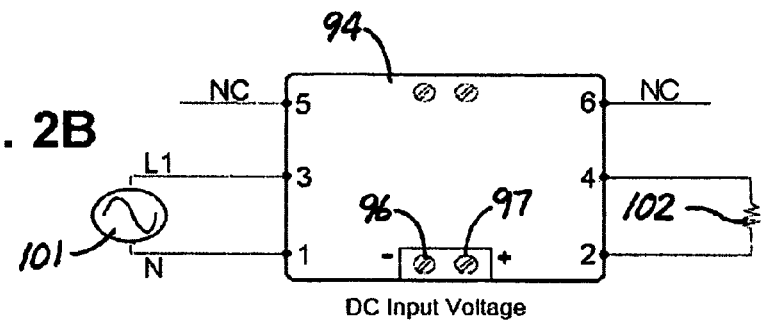

In FIG. 2B, the relay is illustrated in connection with a 120 or 240 volt single-phase AC source 101 and a single-phase load 102. In this embodiment, neutral conductor N is connected to input terminal 1, line conductor L1 is connected to input terminal 3, the load is connected to output terminals 2 and 4, and no connections are made to input terminal 5 and output terminal 6.

Figure 2C:
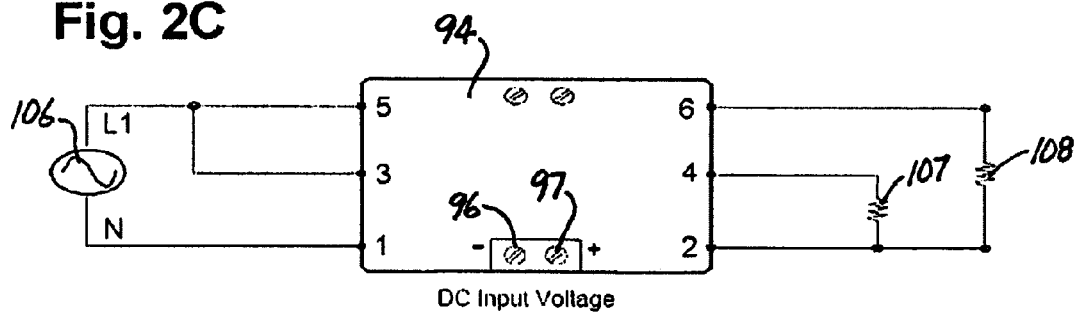
Figure 2D:
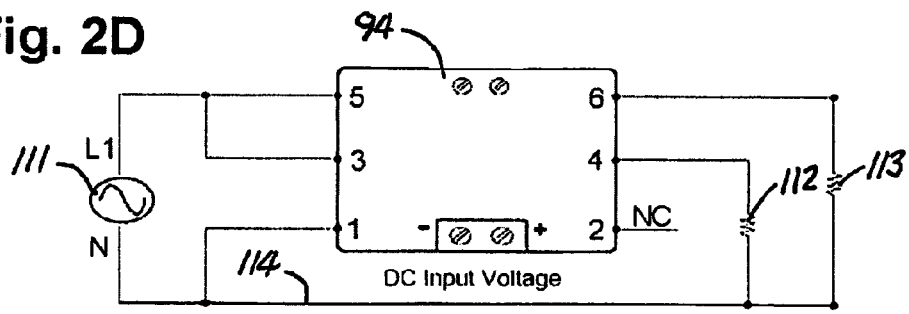

FIG. 2C illustrates use of the relay with a 120 or 240 volt single-phase AC source 106 and two single-phase loads 107, 108, where the total load current is less than the output rating of the relay. In this embodiment, neutral conductor N is connected to input terminal 1, line conductor L1 is connected to input terminals 3 and 5, load 107 is connected to output terminals 2 and 4, and load 108 is connected to output terminals 4 and 6.

In FIG. 2D, use of the relay is illustrated in connection with a 120 or 240 volt single-phase AC source 111 and two single-phase loads 112, 113, where the total load current is greater than the output rating of the relay. In this embodiment, neutral conductor N is connected to input terminal 1 and to a hard-wired return leg 114, line conductor L1 is connected to input terminals 3 and 5, load 112 is connected to output terminal 4 and to return leg 114, and load 113 is connected to output terminal 6 and to return leg 114.

The solid state switches and associated circuitry can be constructed in a single package with the EMR contacts and operating coil, or they can be constructed as a separate unit for use with existing EMRs or contactors. FIGS. 3 5 illustrate an embodiment of the latter type in which the solid state switch is constructed in the form of a separate module 116 which is mounted on and connected to a conventional dedicated purpose contactor 117.

The contactor has a generally rectangular housing 119 in which the electromagnetically operated contacts and operating coil are enclosed, with terminals 121, 122, 123 on one side of the housing for connecting supply conductors L1, L2, L3 to the contacts, with screws 124 for securing the conductors to the terminals. Output terminals 126, 127, 128 are located on the opposite side of the housing for connecting the load to the contacts, with screws 129 for securing the load conductors to the terminals. Operating coil terminals 131, 132 extend from the housing below terminals 121, 122, 123 for connection to supply lines for energizing the coil.

Switch module 116 has a generally rectangular housing 133 that rests on the upper wall of the contactor housing, with depending flanges 134 that overlie the upper portions of the end walls of the contactor housing to hold the module in place. Flat leads 136, 137, 138 and 141, 142, 143 are connected respectively to the line and load terminals of the solid state switching devices within the housing and extend in a downward direction in alignment with the corresponding terminals of the contactor. The lower portions of these leads are bent outwardly for engagement with the contactor terminals, and they are secured to the terminals by screws 124, 129.

Output terminals 146, 147 for the AC switch within the module are provided on the upper wall of housing 133 and are connected to coil terminals 131, 132 by wire leads 148, 149. At one end, these leads have loop lugs 151 which are secured to terminals 146, 147 by screws 153. At the other end, the leads have spade lugs 152 which are secured to terminals 131, 132 by screws 154. An MOV 156 is also connected to terminals 131, 132 to provide overvoltage protection when the coil is energized and the solid state switching device is receiving its control signal Input terminals 157, 158 are also provided on the upper wall of housing 133 for the control signals that open and close the AC switch within the housing.

While the solid state relay module is illustrated as being mounted on top of the contactor in this particular embodiment, it will be understood that the solid state module can equally well be mounted to the side, below, or inside a dedicated purpose contactor, depending upon the application in which it is to be used.

The invention has a number of important features and advantages. It provides a cost effective means of addressing the known limitations of both solid state relays and electromechanical relays, and by combining solid state switching with electromechanical switching, it provides a reliable hybrid power relay with no arcing or transient disturbances when the relay contacts open and close, and it provides the proper timing between the opening and closing of the solid state switching devices and the mechanical relay contacts without complicated control circuits or a computer. It can be used in both single-phase and three-phase system, it allows the large alternating currents to be controlled with a low voltage DC control signal, and it protects the solid state components from overheating without unwieldy heat sinks.

The solid state switching provides a nearly unlimited life expectancy with zero transients during make and break transitions, while the electromechanical relay contacts eliminate nearly all of the thermal heating associated with solid state relays during load current conduction, thus providing a contactor with superior performance.

The solid state and electromechanical sections can be constructed as an integral package, or the solid state switches and associated circuitry can be constructed in the form of a separate module that can be used with existing contactors or relays. It can, for example, be constructed in a housing that mounts on the housing of a commercially available dedicated purpose contactor, with leads that connect directly to the terminals of the contactor and are secured to the terminals by the same screws that connect the supply lines and load to the contactor.

It is apparent from the foregoing that a new and improved hybrid power relay has been provided. While only certain presently preferred embodiments have been described in detail, as will be apparent to those familiar with the art, certain changes and modifications can be made without departing from the scope of the invention as defined by the following claims.

The invention claimed is:

1. A hybrid power relay for making and breaking an electrical circuit, comprising: electromagnetically operated contacts for making and breaking the circuit, a solid state switch connected across the contacts, means responsive to a control signal for actuating the solid state switch and the contacts such that the solid state switch closes before the contacts and remains closed until the contacts close to make the circuit and the contacts open before the solid state switch to break the circuit, and means for monitoring the temperature of the solid state switch and opening the switch in the event of a rise in temperature produced by abnormal current flow in the switch due to failure of the contacts to make and maintain the circuit.

2. The hybrid power relay of claim 1 wherein the solid state switch comprises first and second silicon controlled rectifiers (SCRs) connected back-to-back across the contacts, with the cathode of the first SCR and the anode of the second SCR connected to one of the contacts and the anode of the first SCR and the cathode of the second SCR connected to the other contact.

3. The hybrid power relay of claim 1 wherein the control signal is a low voltage analog DC signal.

4. The hybrid power relay of claim 1 wherein the means for monitoring the temperature of the solid state switch includes a temperature sensitive element in proximity to the switch.

5. The hybrid power relay of claim 1 wherein the means for monitoring the temperature and opening the solid state switch includes a thermistor in proximity to the switch across which a voltage corresponding to the temperature of the switch is developed, and means for comparing the voltage across the thermistor with a reference voltage and opening the switch in the event that the voltage across the thermistor exceeds the reference voltage.

6. The hybrid power relay of claim 1 wherein the means for actuating the solid state switch and the contacts comprises a DC power supply connected to the solid state switch for biasing the switch to an ON state when energized, an operating coil for closing the contacts when energized, and a switching circuit responsive to the control signal for simultaneously applying operating power to the DC power supply and to the operating coil to initiate the making of the circuit.

7. A hybrid power relay for making and breaking a three-phase electrical circuit, comprising: electromagnetically operated contacts for making and breaking each of the three phases of the circuit, solid state switches connected across the contacts, means responsive to a control signal for actuating the solid state switches and the contacts such that the solid state switches close before the contacts and remain closed until the contacts close to make the circuits and the contacts open before the solid state switches to break the circuits, and means for monitoring the temperature of the solid state switches and opening the switches in the event of a rise in temperature produced by abnormal current flow in the switches due to failure of the contacts to make and maintain the circuits.

8. The hybrid power relay of claim 7 wherein each of the solid state switches comprises first and second silicon controlled rectifiers (SCRs) connected back-to-back across the contacts, with the cathode of the first SCR and the anode of the second SCR connected to one of the contacts for the phase and the anode of the first SCR and the cathode of the second SCR connected to the other contact for the phase.

9. The hybrid power relay of claim 7 wherein the control signal is a low voltage analog DC signal.

10. The hybrid power relay of claim 7 wherein the means for monitoring the temperature of the solid state switches includes a temperature sensitive element in proximity to the switches.

11. The hybrid power relay of claim 7 wherein the means for monitoring the temperature and opening the solid state switches includes a thermistor in proximity to the switches across which a voltage corresponding to the temperature of the switches is developed, and means for comparing the voltage across the thermistor with a reference voltage and opening the switches in the event that the voltage across the thermistor exceeds the reference voltage.

12. The hybrid power relay of claim 7 wherein the means for actuating the solid state switches and the contacts comprises a DC power supply connected to the solid state switches for biasing the switches to an ON state when energized, an operating coil for closing the contacts when energized, and a switching circuit responsive to the control signal for simultaneously applying operating power to the DC power supply and to the operating coil to initiate the making of the circuits.

13. A hybrid power relay for making and breaking an electrical circuit, comprising: electromagnetically operated contacts for making and breaking the circuit, first and second silicon controlled rectifiers (SCRs) connected back-to-back across the contacts, with the cathode of the first SCR and the anode of the second SCR connected to one of the contacts and the anode of the first SCR and the cathode of the second SCR connected to the other contact, a DC power supply, means including optocouplers connected to the power supply and to the control gates of the SCR's for biasing the SCRs to an ON state when the power supply is energized, an operating coil for closing the contacts when energized, and a switching circuit responsive to a control signal for simultaneously applying operating power to the DC power supply and to the operating coil, with the SCRs turning on before the contacts close and remaining turned on until the contacts close to make the circuit and the contacts opening before the SCRs turn off to break the circuit.

14. The hybrid power relay of claim 13 wherein the operating coil for the contacts and the power input of the DC power supply are connected in parallel, and the switching circuit includes an additional pair of SCRs coupled back-to-back with each other and in series with an AC power source and the parallel connected operating coil and DC power supply, and optocouplers connected to the control gates of the additional SCRs for biasing the additional SCRs to an ON state to energize the operating coil and the DC power supply in response to the control signal.

15. The hybrid power relay of claim 13 including bidirectional transient voltage suppressors connected across the outputs of the optocouplers.

16. The hybrid power relay of claim 13 including means for monitoring the temperature of the SCRs and turning off the SCRs in the event of a rise in temperature produced by abnormal current flow in the SCRs due to failure of the contacts to make and maintain the circuit.

17. The hybrid power relay of claim 16 wherein the means for monitoring the temperature and turning off the SCRs includes a thermistor in proximity to the SCRs across which a voltage corresponding to the temperature of the SCRs is developed, and means for comparing the voltage across the thermistor with a reference voltage and turning off the SCRs in the event that the voltage across the thermistor exceeds the reference voltage.

18. A hybrid power relay comprising an electromechanical relay having contacts for making and breaking an electrical circuit and a coil for operating the contacts inside a housing with terminals outside the housing for connecting the contacts to line and load conductors and for connecting the operating coil to an AC power source, and a solid state switching module having a solid state switching device in a housing mounted on the contactor housing, with leads extending from the switching module to the line and load terminals to connect the solid state switching device electrically in parallel with the electromechanical relay contacts.

19. The hybrid power relay of claim 18 wherein the solid state switching module includes a DC power supply that supplies operating current for the solid state switching device and a control circuit for applying operating power to the DC power supply in response to a control signal, with leads extending from the module to the operating coil terminals and connecting the control circuit to the operating coil.

20. The hybrid power relay of claim 18 wherein the solid state switching module is mounted on top of the contactor housing.

* * * * *